United States Patent
Chang (10) Patent No.: US 12,027,214 B2
(45) Date of Patent: Jul. 2, 2024

(54) SENSING DEVICE FOR NON-VOLATILE MEMORY

(71) Applicant: eMemory Technology Inc., Hsin-Chu (TW)

(72) Inventor: Che-Wei Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 169 days.

(21) Appl. No.: 17/949,255

(22) Filed: Sep. 21, 2022

(65) Prior Publication Data

US 2023/0197165 A1 Jun. 22, 2023

Related U.S. Application Data

(60) Provisional application No. 63/361,376, filed on Dec. 16, 2021.

(51) Int. Cl.
| | |
|---|---|
| G11C 16/26 | (2006.01) |
| G11C 16/08 | (2006.01) |
| G11C 16/30 | (2006.01) |
| G11C 16/32 | (2006.01) |

(52) U.S. Cl.
CPC ............ *G11C 16/26* (2013.01); *G11C 16/08* (2013.01); *G11C 16/30* (2013.01); *G11C 16/32* (2013.01)

(58) Field of Classification Search
CPC ......... G11C 16/26; G11C 16/08; G11C 16/30; G11C 16/32; G11C 7/062; G11C 7/067; G11C 16/28; G11C 16/04; G11C 16/10; G11C 16/34; Y02D 10/00

USPC ..................................................... 365/185.21
See application file for complete search history.

(56) References Cited

U.S. PATENT DOCUMENTS

| | | | |
|---|---|---|---|
| 8,531,865 B2 | 9/2013 | Hosono et al. | |
| 2008/0144385 A1* | 6/2008 | Koji .................. | G11C 16/28 |
| | | | 365/185.21 |
| 2008/0186786 A1 | 8/2008 | Lin | |
| 2020/0388333 A1 | 12/2020 | Lin et al. | |

FOREIGN PATENT DOCUMENTS

| | | | | |
|---|---|---|---|---|
| CN | 110998736 A | * | 4/2020 | ............. G11C 16/28 |
| EP | 0412837 A2 | * | 2/1991 | |
| TW | 202042223 A | * | 11/2020 | ......... G11C 11/4074 |

* cited by examiner

*Primary Examiner* — Fernando Hidalgo
(74) *Attorney, Agent, or Firm* — WPAT, P.C (57) ABSTRACT

A sensing device for a non-volatile memory includes a reference circuit, two switches, a sensing circuit and a judging circuit. The reference circuit is connected to a first node. A first terminal of the first switch is connected with the first node and a control terminal of the first switch receives an inverted reset pulse. A first terminal of the second switch is connected with the first node, a second terminal of the second switch receives a ground voltage, and a control terminal of the second switch receives a reset pulse. The sensing circuit is connected between the second terminal of the first switch and a second node. The sensing circuit generates a first sensed current. The judging circuit is connected to the second node. The judging circuit receives the first sensed current and generates an output data according to the first sensed current.

19 Claims, 7 Drawing Sheets

SENSING DEVICE FOR NON-VOLATILE MEMORY

This application claims the benefit of U.S. provisional application Ser. No. 63/361,376, filed Dec. 16, 2021, the subject matter of which is incorporated herein by reference.

FIELD OF THE INVENTION

The present invention relates to a sensing device, and more particularly to a sensing device for a non-volatile memory.

BACKGROUND OF THE INVENTION

As is well known, a solid state storage device such as a SD card or a solid state drive (SSD) is widely used in a variety of electronic devices. Generally, the solid state drive comprises a memory array, and the memory array comprises plural memory cells. Each memory cell comprises a floating gate transistor. The floating gate transistor of each memory cell has a floating gate to store hot carriers. The storing state of the floating gate transistor may be determined according to the amount of the stored hot carriers. Moreover, the floating gate transistor is also referred as a storage transistor.

Generally, after the hot carriers are injected into the floating gate transistor, a threshold voltage ($V_T$) of the floating gate transistor is changed according to the amount of the injected hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the non-volatile memory, the threshold voltage of the floating gate transistor may be changed by controlling the amount of hot carriers to be injected into the floating gate. During a sense cycle of the non-volatile memory, a read voltage is provided to the floating gate transistor, and thus a cell current (also referred as a read current) is generated. According to the cell current, the storing state (e.g., an on state or an off state) of the floating gate transistor of the memory cell can be judged.

For example, if the read voltage is provided to the floating gate transistor with the lower threshold voltage, the floating gate transistor is in the on state to generate a higher cell current. Whereas, if the read voltage is provided to the floating gate transistor with the higher threshold voltage, the floating gate transistor is in the off state to generate a nearly-zero cell current. That is, during the sense cycle, the on-state memory cell generates a higher cell current, but the off-state memory cell generates a lower cell current.

Moreover, the non-volatile memory further comprises a sensing device for receiving the cell current from the memory cell, thereby judging the storing state of the memory cell.

Figure 1:
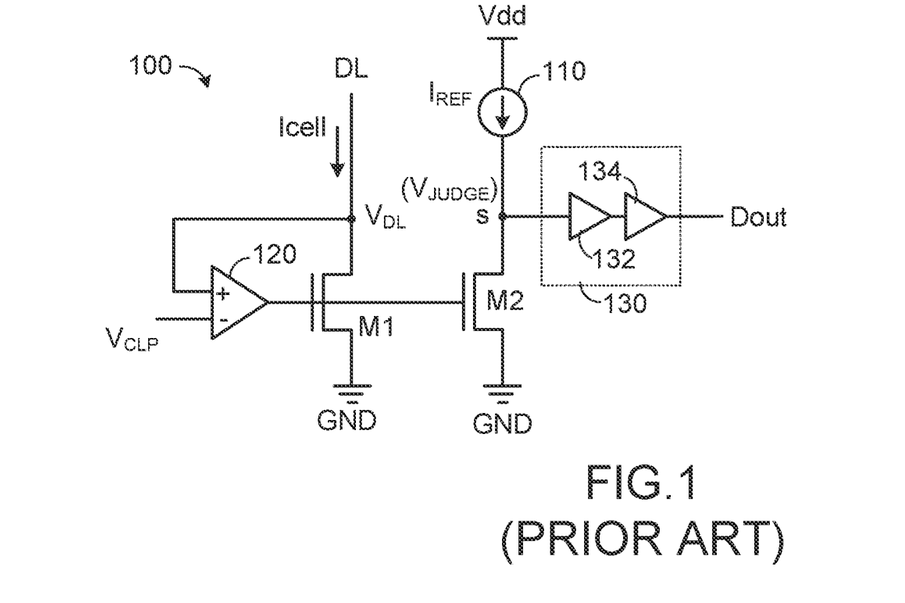
FIG. 1 (prior art) is a schematic circuit diagram illustrating a conventional sensing device.

FIG. 1 is a schematic circuit diagram illustrating a conventional sensing device. As shown in FIG. 1, the sensing device 100 comprises a transistor M1, a transistor M2, a current source 110, an operational amplifier 120 and a judging element 130.

The transistor M1 and the operational amplifier 120 are collaboratively defined as a voltage clamping circuit. The drain terminal of the transistor M1 is connected with a data line DL to receive a cell current Icell from the memory cell. The gate terminal of the transistor M1 is connected with the output terminal of the operational amplifier 120. The source terminal of the transistor M1 receives a ground voltage GND. The first input terminal of the operational amplifier 120 receives a clamping voltage $V_{CLP}$. The second input terminal of the operational amplifier 120 is connected with the drain terminal of the transistor M1. Consequently, when the voltage clamping circuit is in a normal working state, a data line voltage $V_{DD}$ at the drain terminal of the transistor M1 is equal to the clamping voltage $V_{CLP}$.

The current source 110 is connected between a supply voltage Vdd and a judging node s. The current source 110 generates a reference current $I_{REF}$. The drain terminal of the transistor M2 is connected with the judging node s. The drain terminal of the transistor M2 receives the reference current $I_{REF}$. The gate terminal of the transistor M2 is connected with the gate terminal of the transistor M1. The source terminal of the transistor M2 receives the ground voltage GND. The supply voltage Vdd is higher than the clamping voltage $V_{CLP}$. The clamping voltage $V_{CLP}$ is higher than the ground voltage GND. For example, the supply voltage Vdd is in the range between 3.3V and 5V, and the clamping voltage $V_{CLP}$ is in the range between 0.2V and 0.4V.

The input terminal of the judging element 130 is connected with the judging node s to receive a judging voltage $V_{JUDGE}$ from the judging node s. The output terminal of the judging element 130 generates an output data Dout. For example, the judging element 130 comprises two logic buffers 132 and 134. The logic buffers 132 and 134 are serially connected between the input terminal and the output terminal of the judging element 130. Consequently, during the sense cycle, the memory cell is judged to be in an on state or an off state according to the output data Dout of the judging element 130. Moreover, each of the logic buffer 132 and 134 is implemented with two NOT gates in serial connection.

During the sense cycle, the data line DL is connected with the memory cell to receive the cell current Icell. If the cell current Icell on the data line DL is higher than the reference current $I_{REF}$, the judging voltage $V_{JUDGE}$ is pulled down to the ground voltage GND. Consequently, the judging element 130 issues the output data Dout with a first logic level (e.g., a low logic level) to indicate that the memory cell is in the on state. Whereas, if the cell current Icell on the data line DL is lower than the reference current $I_{REF}$, the judging voltage $V_{JUDGE}$ is pulled up to the supply voltage Vdd. Consequently, the judging element 130 issues the output data Dout with a second logic level (e.g., a high logic level) to indicate that the memory cell is in the off state.

From the above discussions, the sensing device 100 can judge the storing state of the memory cell according to the cell current Icell generated by the memory cell.

However, the conventional sensing device 100 still has some drawbacks. As mentioned above, the operational amplifier 120 of the sensing device 100 is connected with the data line DL. Since the operational amplifier 120 is connected as a negative feedback amplifier, the noise is amplified according to the high gain of the operational amplifier 120, and the judging voltage $V_{JUDGE}$ at the judging node s is influenced. For example, the ground noise is amplified by the operational amplifier 120. Consequently, the judging voltage $V_{JUDGE}$ at the judging node s is not stable. Due to the unstable judging voltage $V_{JUDGE}$, the judging element 130 may be suffered from misjudgment.

SUMMARY OF THE INVENTION

An embodiment of the present invention provides a sensing device for a non-volatile memory. The non-volatile memory includes a memory cell. The memory cell is connected with a data line during a sense cycle. The sensing device includes a first current source, wherein the first current source is connected between a supply voltage and a first node, and the first current source generates a reference current; a first current mirror, wherein an input terminal of the first current mirror is connected with the first node, a mirroring terminal of the first current mirror is connected with a second node, and the second node is connected with the data line; a first switch, wherein a first terminal of the first switch is connected with the second node, and a control terminal of the first switch receives an inverted reset pulse; a second switch, wherein a first terminal of the second switch is connected with the second node, a second terminal of the second switch receives a ground voltage, and a control terminal of the second switch receives a reset pulse; a first transistor, wherein a drain terminal of the first transistor is connected with a third node, a source terminal of the first transistor is connected with a second terminal of the first switch, and a gate terminal of the first transistor receives a clamping voltage; a second current mirror, wherein an input terminal of the second current mirror is connected with the third node, and a mirroring terminal of the second current mirror is connected with a fourth node; a third current mirror, wherein an input terminal of the third current mirror is connected with the fourth node, and a mirroring terminal of the third current mirror is connected with a judging node; a second current source connected between the supply voltage and the judging node, wherein the second current source generates a judging current; and a judging element, wherein an input terminal of the judging element is connected with the judging node, and an output terminal of the judging element generates an output data.

An embodiment of the present invention provides a sensing device for a non-volatile memory. The non-volatile memory includes a memory cell. The memory cell is connected with a data line for generating a cell current to a first node during a sense cycle. The sensing device includes a reference circuit, connected to a first node, configured to provide a reference current; a first switch, having a first terminal connected with the first node and a control terminal configured to receive an inverted reset pulse; a second switch, having a first terminal connected with the first node, a second terminal configured to receive a ground voltage, and a control terminal configured to receive a reset pulse, wherein the reset pulse is complementary to the inverted reset pulse; a sensing circuit connected between a second terminal of the first switch and a second node, configured to generate a first sensed current according to a difference between the cell current and the reference current; and a judging circuit connected to the second node, configured to receive the first sensed current and generate an output data according to the first sensed current; wherein when the cell current is higher than the reference current, the first sensed current is substantially equal to zero and the output data corresponds to a first logic level; wherein when the cell current is lower than the reference current, the first sensed current is higher than zero and the output data corresponds to a second logic level.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 2:
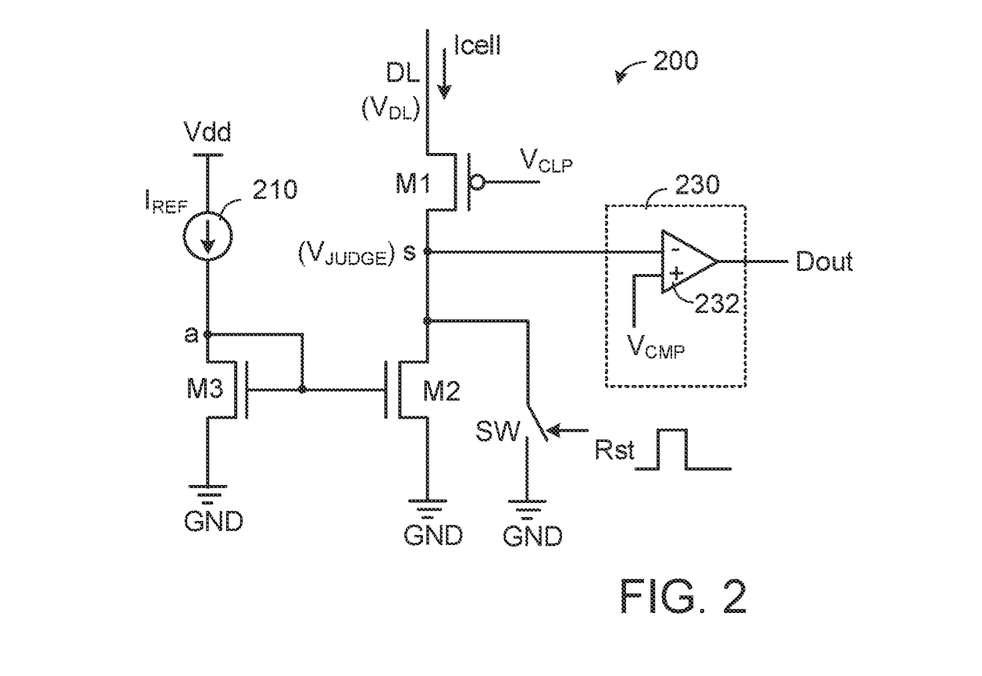
FIG. 2 is a schematic circuit diagram illustrating a sensing device according to a first embodiment of the present invention.

FIG. 2 is a schematic circuit diagram illustrating a sensing device according to a first embodiment of the present invention. The sensing device 200 is applied to a non-volatile memory (not shown). The sensing device 200 comprises a transistor M1, a transistor M2, a transistor M3, a current source 210, a switch SW and a judging element 230.

The source terminal of the transistor M1 is connected with a data line DL to receive a cell current Icell from a memory cell of the non-volatile memory. The gate terminal of the transistor M1 receives a clamping voltage $V_{CLP}$. The drain terminal of the transistor M1 is connected with a judging node s. During a sense cycle, the memory cell is connected with the data line DL, and a data line voltage $V_{DL}$ is equal to ($V_{CLP}-V_T$), wherein $V_T$ is the threshold voltage of the transistor M1.

The current source 210 is connected between a supply voltage Vdd and a node a. The current source 210 generates a reference current $I_{REF}$. The transistor M2 and the transistor M3 are collaboratively formed as a current mirror. The drain terminal of the transistor M2 is connected with the judging node s. The gate terminal of the transistor M2 is connected with the node a. The source terminal of the transistor M2 receives a ground voltage GND. The drain terminal of the transistor M3 is connected with the node a. The gate terminal of the transistor M3 is connected with the node a. The source terminal of the transistor M3 receives the ground voltage GND.

The first terminal of the switch SW is connected with the judging node s. The second terminal of the switch SW receives the ground voltage GND. The control terminal of the switch SW receives a reset pulse Rst.

The input terminal of the judging element 230 is connected with the judging node s to receive a judging voltage $V_{JUDGE}$ from the judging node s. The output terminal of the judging element 230 generates an output data Dout. In an embodiment, the judging element 230 comprises a comparator 232. The first input terminal of the comparator 232 is connected with the judging node s to receive the judging voltage $V_{JUDGE}$. The second input terminal of the comparator 232 receives a comparison voltage $V_{CMP}$. The output terminal of the comparator 232 generates the output data Dout. The comparison voltage $V_{CMP}$ is higher than the ground voltage GND, and the comparison voltage $V_{CMP}$ is lower than the supply voltage Vdd.

In an initial stage of the sense cycle, the switch SW receives the reset pulse Rst. In response to the reset pulse Rst, the switch SW is in a closed state. Consequently, the judging voltage $V_{JUDGE}$ at the judging node s is discharged to the ground voltage GND. After the reset pulse Rst, the switch SW is in an opened state. Consequently, the judging voltage $V_{JUDGE}$ at the judging node s is changed according to the cell current Icell. Consequently, the storing state of the memory cell can be judged by the judging element 230 according to the judging voltage $V_{JUDGE}$.

For example, if the cell current Icell from the data line DL is higher than the reference current $I_{REF}$, the judging voltage $V_{JUDGE}$ is charged to a voltage (e.g., the supply voltage Vdd) higher than the comparison voltage $V_{CMP}$. Consequently, the judging element 230 issues the output data Dout with a first logic level (e.g., a low logic level) to indicate that the memory cell is in the on state. Whereas, if the cell current Icell from the data line DL is lower than the reference current $I_{REF}$, the judging voltage $V_{JUDGE}$ is maintained at the ground voltage GND. Consequently, the judging element 230 issues the output data Dout with a second logic level (e.g., a high logic level) to indicate that the memory cell is in the off state.

In the above embodiment, the judging element 230 comprises the comparator 232. It is noted that the constituents of the judging element 230 are not restricted. For example, in another embodiment, the comparator 232 of the judging element 230 is replaced by a logic buffer. For example, the logic buffer comprises two NOT gates in serial connection. The input terminal of the logic buffer is connected to the judging node s. The output terminal of the logic buffer generates the output data Dout. Consequently, during the sense cycle, the memory cell is judged to be in the on state or the off state according to the output data Dout of the judging element 230.

In the first embodiment, the sensing device 200 is not equipped with the operational amplifier. Consequently, the sensing device 200 is less sensitive to the noise. Moreover, the transistor M1 is connected between the data line DL and the judging node s. Consequently, the gate-source voltage $V_{gs}$ of the transistor M1 affects the read speed of the sensing device 200. For example, it is assumed that the gate-source voltage $V_{gs}$ is −1V. Consequently, during the sense cycle, the clamping voltage $V_{CLP}$ is the lowest ground voltage GND, and the data line voltage $V_{DL}$ is 1V. That is, $V_{DL}=V_{CLP}-V_{gs}=[0V-(-1V)]=1V$. Since the 1V data line voltage $V_{DL}$ is too high, the read speed of the sensing device 200 is adversely affected. Moreover, the variation of the pulse width of a reset pulse Rst influences the output data Dout of the sensing device 200.

Figure 3:
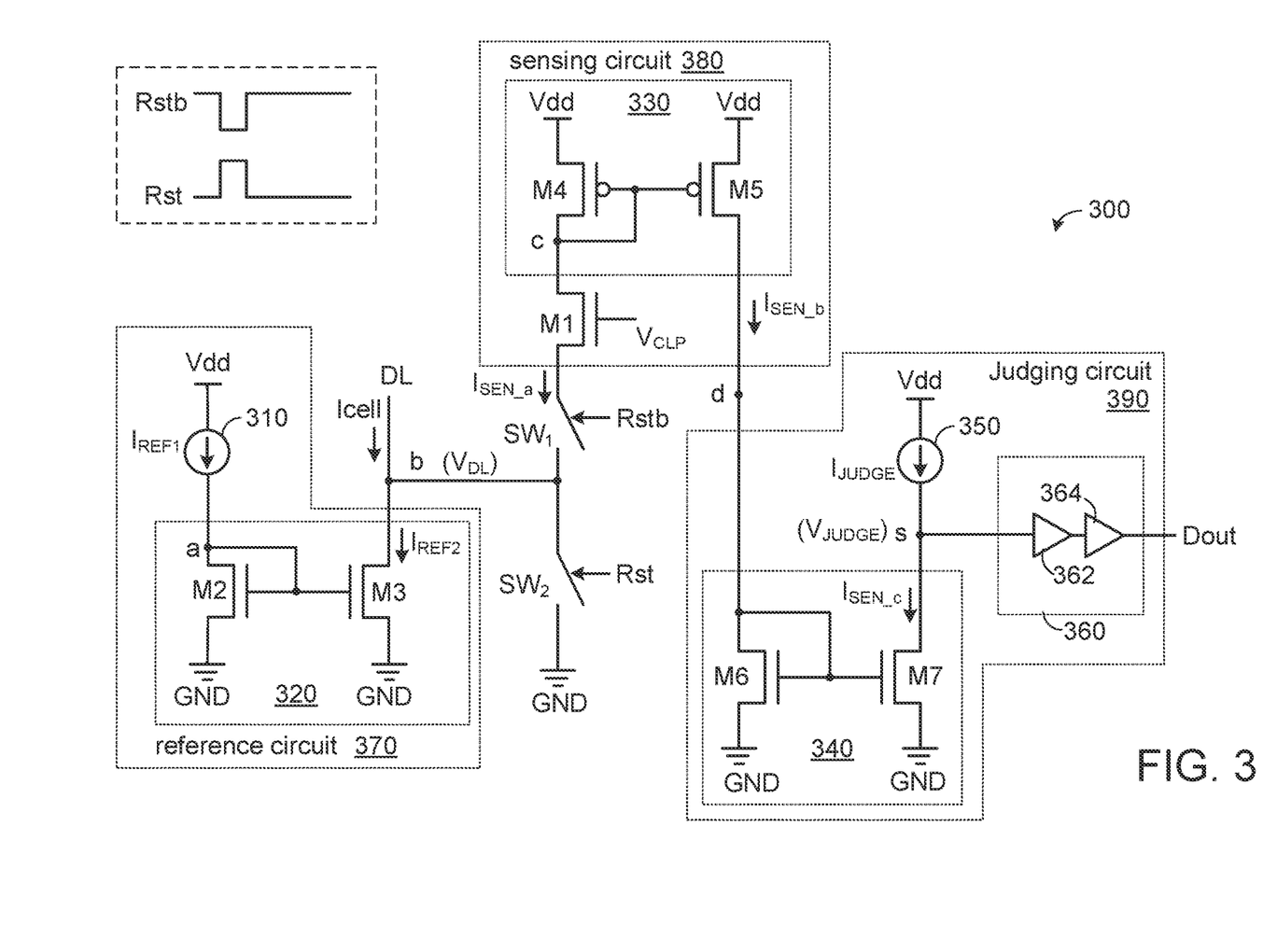
FIG. 3 is a schematic circuit diagram illustrating a sensing device according to a second embodiment of the present invention.

FIG. 3 is a schematic circuit diagram illustrating a sensing device according to a second embodiment of the present invention. The sensing device 300 comprises a reference circuit 370, two switches $SW_1$ and $SW_2$, a sensing circuit 380 and a judging circuit 390.

The data line DL is connected with a node b to receive a cell current Icell from a memory cell of the non-volatile memory. The reference circuit 370 is connected to the node b, and the reference circuit 370 is configured to providing a reference current $I_{REF2}$ to the node b.

The first terminal of the switch $SW_1$ is connected with the node b, the second terminal of the switch $SW_1$ is connected with the sensing circuit, and the control terminal of the switch $SW_1$ receives an inverted reset pulse Rstb. The first terminal of the switch $SW_2$ is connected with the node b, the second terminal of the switch $SW_2$ receives the ground voltage GND, and the control terminal of the switch $SW_2$ receives a reset pulse Rst. The reset pulse Rst and the inverted reset pulse Rstb are complementary to each other.

The sensing circuit 380 is connected between the second terminal of the switch $SW_1$ and a node d. The sensing circuit 380 is configured to generate a sensed current $I_{SEN\_b}$ according to a difference between the cell current Icell and the reference current $I_{REF2}$.

The judging circuit 390 is connected to the node d, and the judging circuit 390 is configured to receive the sensed current $I_{SEN\_b}$ and generate an output data Dout according to the sensed current $I_{SEN\_b}$.

According to the second embodiment of the present invention, when the cell current Icell is higher than the reference current $I_{REF2}$, the sensed current $I_{SEN\_b}$ is substantially equal to zero and the output data Dout corresponds to a first logic level. When the cell current Icell is lower than the reference current $I_{REF2}$, the sensed current $I_{SEN\_b}$ is higher than zero and the output data Dout corresponds to a second logic level.

The reference circuit 370 comprises a current source 310 and a current mirror 320. The input terminal of the current mirror 320 is connected with the node a. The mirroring terminal of the current mirror 320 is connected with the node b. The current source 310 is connected between the supply voltage Vdd and the node a. The current source 310 generates a reference current $I_{REF1}$. Consequently, the input terminal of the current mirror 320 receives the reference current $I_{REF1}$ and generates the reference current $I_{REF2}$ correspondingly.

The current mirror 320 comprises transistors M2 and M3. The drain terminal of the transistor M2 is connected with the node a. The gate terminal of the transistor M2 is connected with the node a. The source terminal of the transistor M2 receives the ground voltage GND. The drain terminal of the transistor M3 is connected with the node b. The gate terminal of the transistor M3 is connected to the node a. The source terminal of the transistor M3 receives the ground voltage GND. In an embodiment, the sizes of the transistors M2 and M3 are identical. Consequently, the reference current $I_{REF1}$ received by the input terminal of the current mirror 320 and the reference current $I_{REF2}$ flowing through the mirroring terminal of the current mirror 320 (from the node b toward the transistor M3) are equal. In another embodiment, the sizes of the transistors M2 and M3 are different. Under this circumstance, the reference current $I_{REF1}$ received by the input terminal of the current mirror 320 and the reference current $I_{REF2}$ flowing through the mirroring terminal of the current mirror 320 are in a specified proportional relationship.

The sensing circuit 380 comprises a current mirror 330 and a transistor M1. The transistor M1 is used as a clamping transistor. The drain terminal of the transistor M1 is connected with the node c. The gate terminal of the transistor M1 receives a clamping voltage $V_{CLP}$. The source terminal of the transistor M1 is capable of receiving a sensed current $I_{SEN\_a}$. The clamping voltage $V_{CLP}$ is generated from the voltage clamping circuit, which will be described in FIG. 5A and FIG. 5B in detail.

The input terminal of the current mirror 330 is connected with the node c to receive the sensed current $I_{SEN\_a}$. The mirroring terminal of the current mirror 330 is connected with the node d to generate a sensed current $I_{SEN\_b}$. Moreover, the current mirror 330 comprises transistors M4 and M5. The drain terminal of the transistor M4 is connected with the node c. The gate terminal of the transistor M4 is connected with the node c. The source terminal of the transistor M4 receives a supply voltage Vdd. The drain terminal of the transistor M5 is connected with the node d. The gate terminal of the transistor M5 is connected with the node c. The source terminal of the transistor M5 receives the supply voltage Vdd. In an embodiment, the sizes of the transistors M4 and M5 are identical. Consequently, the sensed current $I_{SEN\_a}$ flowing through the input terminal of the current mirror 330 and the sensed current $I_{SEN\_b}$ flowing through the mirroring terminal of the current mirror 330 identical. In another embodiment, the sizes of the transistors M4 and M5 are different. Under this circumstance, the sensed current $I_{SEN\_a}$ flowing through the input terminal and the sensed current $I_{SEN\_b}$ flowing through the mirroring terminal of the current mirror 330 are in a specified proportional relationship.

The judging circuit 390 comprises a current mirror 340, a current source 350 and a judging element 360. The input terminal of the current mirror 340 is connected with the node d to receive the sensed current $I_{SEN\_b}$ The mirroring terminal of the current mirror 340 is capable of generating a sensed current $I_{SEN\_c}$, and the mirroring terminal of the current mirror 340 is connected with a judging node s. The current source 350 is connected between the supply voltage Vdd and the judging node s. The current source 350 generates a judging current $I_{JUDGE}$.

The current mirror 340 comprises transistors M6 and M7. The drain terminal of the transistor M6 is connected with the node d. The gate terminal of the transistor M6 is connected with the node d. The source terminal of the transistor M6 receives the ground voltage GND. The drain terminal of the transistor M7 is connected with the judging node s. The gate terminal of the transistor M7 is connected with the node d. The source terminal of the transistor M7 receives the ground voltage GND. In an embodiment, the sizes of the transistors M6 and M7 are identical. Consequently, the sensed current $I_{SEN\_b}$ flowing through the input terminal of the current mirror 340 and the sensed current $I_{SEN\_c}$ flowing through the mirroring terminal of the current mirror 340 are identical. In another embodiment, the sizes of the transistors M6 and M7 are different. Under this circumstance, the sensed current $I_{SEN\_b}$ flowing through the input terminal of the current mirror 340 and the sensed current $I_{SEN\_c}$ flowing from the node s toward the mirroring terminal of the current mirror 340 are in a specified proportional relationship.

The input terminal of the judging element 360 is connected with the judging node s to receive a judging voltage $V_{JUDGE}$ from the judging node. The output terminal of the judging element 360 generates the output data Dout. For example, the judging element 360 comprises logic buffers 362 and 364. The logic buffers 362 and 364 are serially connected between the input terminal and the output terminal of the judging element 360.

Figure 4A:
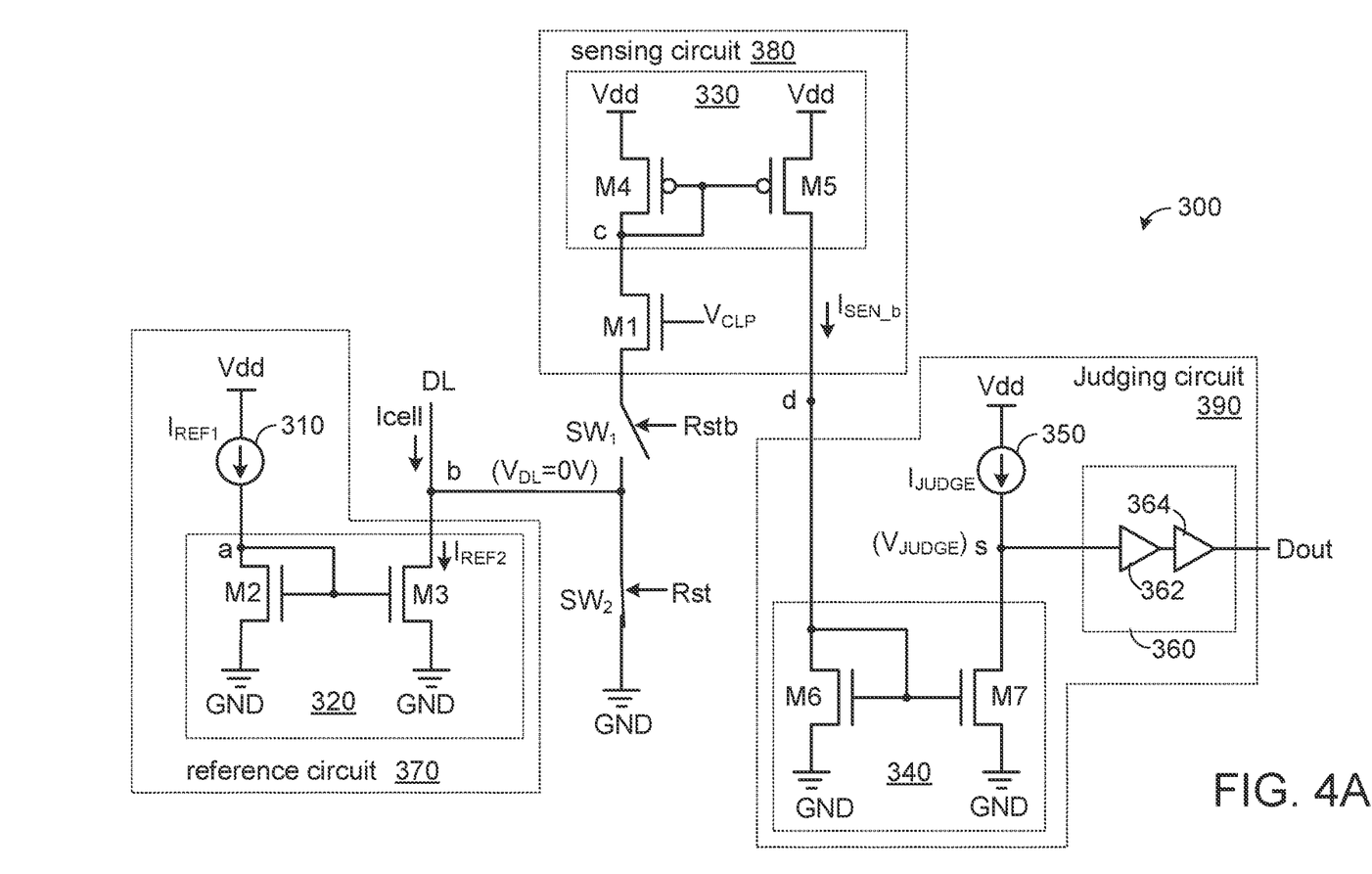
FIGS. 4A, 4B and 4C are schematic circuit diagrams illustrating the operations of the sensing device according to the embodiment according to the second embodiment of the present invention during the sense cycle.
Figure 4B:
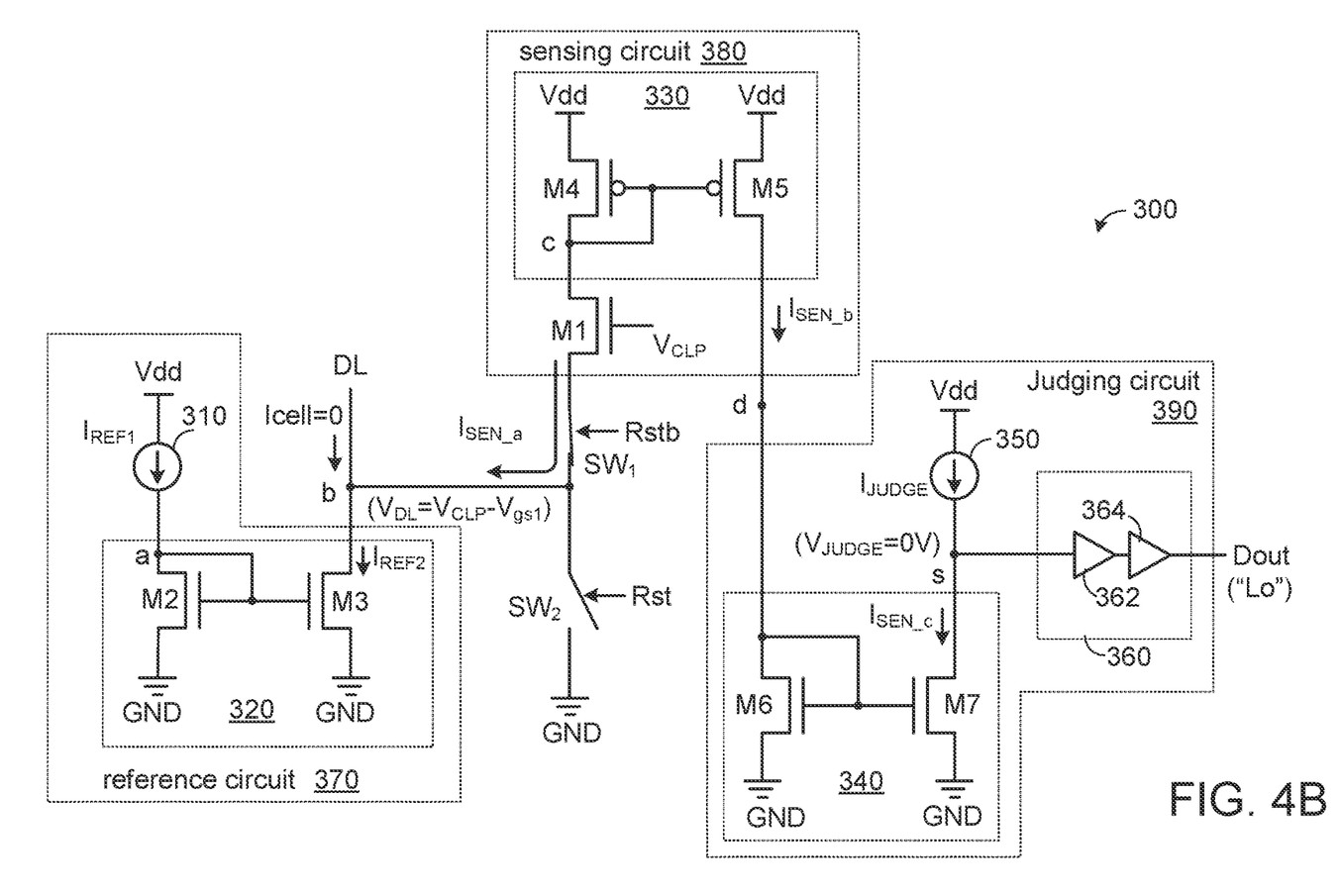
Figure 4C:
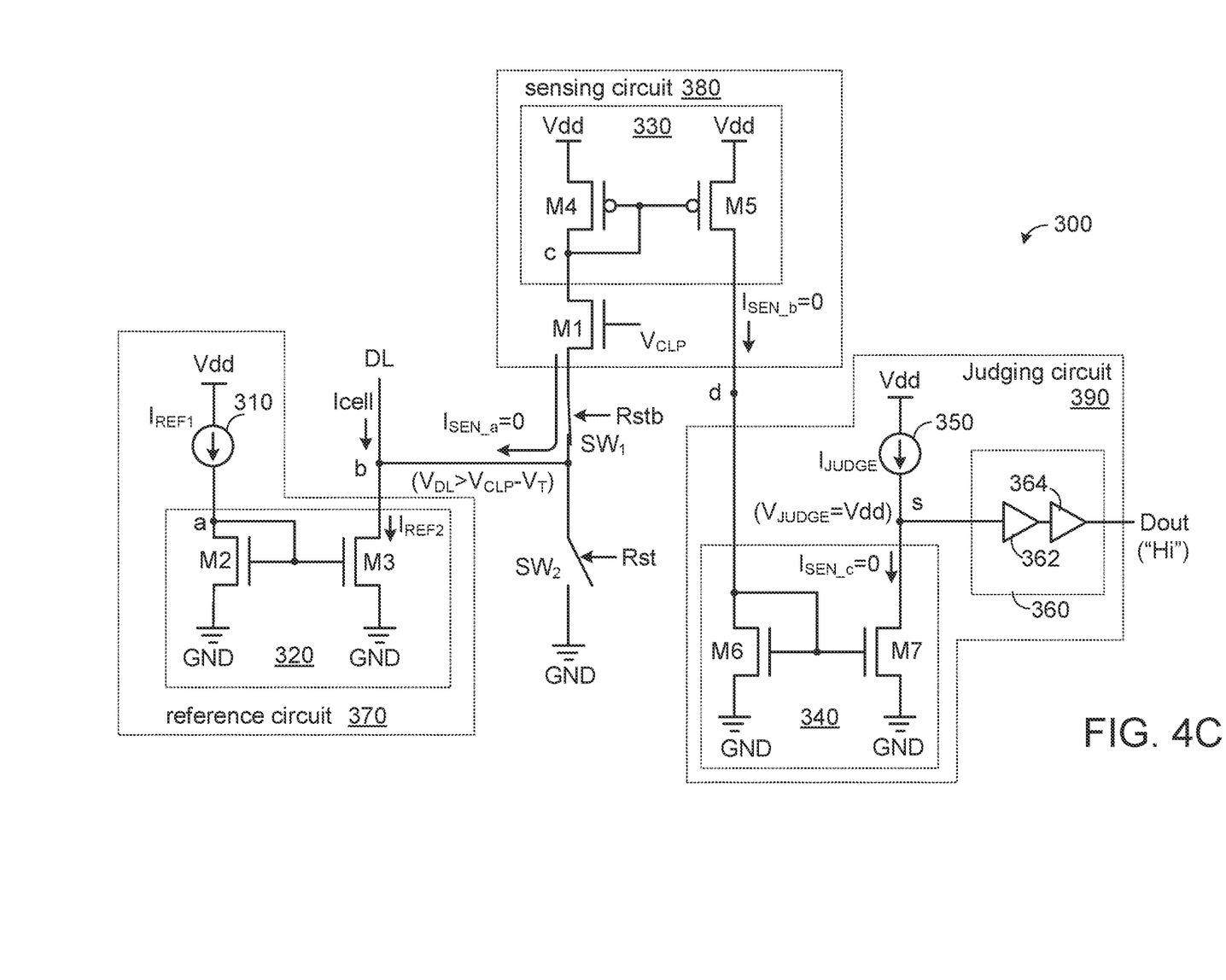
Figure 4D:
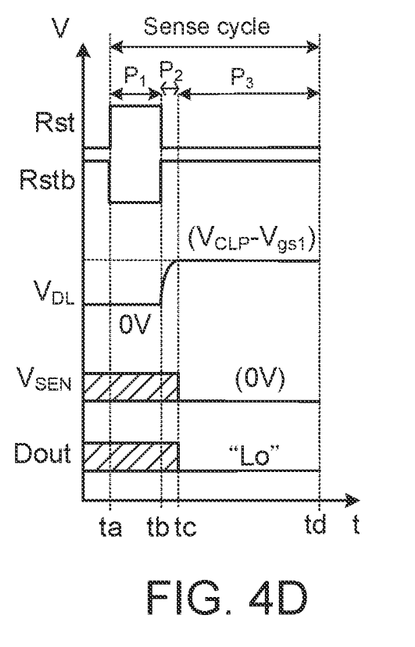
FIGS. 4D and 4E are schematic timing waveform diagrams illustrating associated signals of the sensing device during the sense cycle.
Figure 4E:
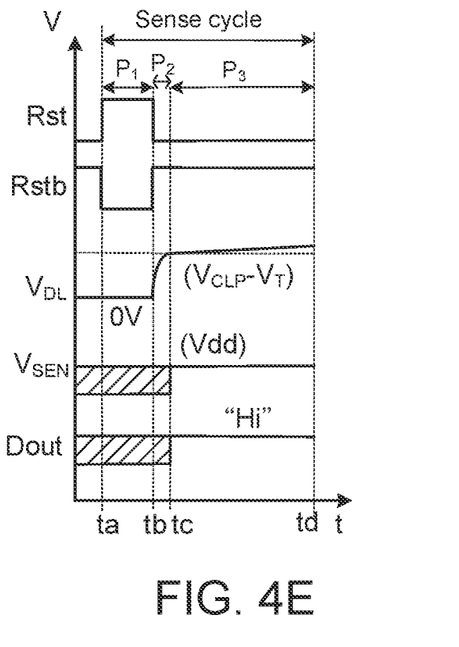

FIGS. 4A, 4B and 4C are schematic circuit diagrams illustrating the operations of the sensing device according to the embodiment according to the second embodiment of the present invention during the sense cycle. FIGS. 4D and 4E are schematic timing waveform diagrams illustrating associated signals of the sensing device during the sense cycle.

In case that the storing state of the memory cell connected with the data line DL is the off state, the operations of the sensing device 300 can be shown in FIGS. 4A, 4B and 4D. Generally, a sense cycle includes a reset phase $P_1$, a pre-charge phase $P_2$ and a sense phase $P_3$.

Please refer to FIGS. 4A and 4D. In time interval between the time point to and the time point tb (i.e., the reset phase $P_1$ of the sense cycle), the switch $SW_2$ is in the closed state in response to the reset pulse Rst, and the switch $SW_1$ is in the opened state in response to the inverted reset pulse Rstb. Consequently, the data line voltage $V_{DL}$ at the node b is reset to the ground voltage GND. That is, $V_{DL}$=0V.

Please refer to FIGS. 4B and 4D. In time interval between the time point tb and the time point tc (i.e., the pre-charge phase $P_2$ of the sense cycle), the reset pulse Rst is fell, so the switch $SW_2$ is in the opened state and the switch $SW_1$ is in the closed state. Since the memory cell connected with the data line DL is the off state, the cell current Icell is very low or nearly zero (Icell=0). Furthermore, the reference circuit 370 generates the reference current $I_{REF2}$. Consequently, the transistor M1 is turned on to generate the sensed current $I_{SEN\_a}$ equal to the reference $I_{REF2}$, then the data line voltage $V_{DL}$ is pre-charged to a voltage ($V_{CLP}$-$V_{gs1}$), wherein $V_{gs1}$ is the gate-source voltage of the transistor M1 capable of generating the sensed current $I_{SEN\_a}$. The clamping voltage $V_{CLP}$ can be adjusted according to a target magnitude of the voltage at the node b when the pre-charge phase $P_2$ is finished.

Please refer to FIGS. 4B and 4D. In time interval between the time point tc and the time point td (i.e., the sense phase $P_3$ of the sense cycle). Since the storing state of the memory cell is in the off state, the cell current Icell is very low or nearly zero (Icell=0). Therefore, in time interval between the time point tc and the time point td, the sensed current $I_{SEN\_a}$ is equal to the reference current $I_{REF2}$, and the data line voltage $V_{DL}$ can be maintained. That is to say, the data line voltage $V_{DL}$ is kept at the voltage ($V_{CLP}$-$V_{gs1}$).

According to the sensed current $I_{SEN\_a}$, a sensed current $I_{SEN\_b}$ generated at the mirroring terminal of the current mirror 330 is received by the input terminal (the node d) of the current mirror 340, and the sensed current $I_{SEN\_c}$ is generated at the mirroring terminal (the judging node s) of the current mirror 340 according to the sensed current $I_{SEN\_b}$. At the mirroring terminal of the current mirror 340, the sensed current $I_{SEN\_c}$ is higher than the judging current $I_{JUDGE}$, and the voltage at the judging node s is pulled down to the ground voltage GND. That is, the judging voltage $V_{JUDGE}$ is equal to 0V. Consequently, in the sense phase $P_3$ of the sense cycle, the judging element 360 issues the output data Dout with a first logic level (e.g., a low logic level "Lo") to indicate that the memory cell is in the off state.

In case that the storing state of the memory cell connected with the data line DL is in the on state, the operations of the sensing device 300 can be shown in FIGS. 4A, 4C and 4E. The reset phase $P_1$ in FIGS. 4A and 4E are the same as those in FIGS. 4A and 4D, and will not be described repeatedly herein.

Please refer to FIGS. 4C and 4E, in time interval between the time point tb and the time point tc (i.e., the pre-charge phase P₂ of the sense cycle), the reset pulse Rst is fell, so the switch SW₂ is in the opened state and the switch SW₁ is in the closed state. Since the memory cell connected with the data line DL is the on state, the cell current Icell is higher than the reference current $I_{REF2}$. Consequently, the sensed current $I_{SEN\_a}$ is equal to zero, and the transistor M1 is turned off, then the data line voltage $V_{DL}$ is pre-charged to a voltage ($V_{CLP}$-$V_T$), wherein $V_T$ is the threshold voltage of the transistor M1. For example, the threshold voltage $V_T$ of the transistor M1 is equal to 0.7V.

Please refer to FIGS. 4C and 4E. When the storing state of the memory cell is in the on state, the cell current Icell on the data line DL is higher than the reference current $I_{REF2}$. Therefore, in time interval between the time point tc and the time point td (i.e., the sense phase P₃ of the sense cycle), the data line voltage $V_{DL}$ at the node b is charged and starts to rise from the voltage ($V_{CLP}$-$V_T$). That is, $V_{DL}$>$V_{CLP}$-$V_T$. Consequently, the transistor M1 is turned off and unable to generate the sensed current $I_{SEN\_a}$. Under this circumstance, the sensed current $I_{SEN\_a}$ is substantially equal to zero.

Since the sensed current $I_{SEN\_a}$ is zero, the sensed current $I_{SEN\_b}$ generated at the mirroring terminal of the current mirror 330 is zero, and the sensed current $I_{SEN\_c}$ at the mirroring terminal of the current mirror 340 is also zero. Consequently, the judging voltage $V_{JUDGE}$ at the judging node s is pulled up to the supply voltage Vdd, so the judging element 360 issues the output data Dout with a second logic level (e.g., a high logic level "Hi") to indicate that the memory cell is in the on state.

In the above description, it is assumed that the transistors M2, M3, M4, M5, M6 and M7 have the same size. The reference current $I_{REF1}$ and the reference current $I_{REF2}$ are identical. The sensed current $I_{SEN\_a}$, the sensed current $I_{SEN\_b}$, and the sensed current $I_{SEN\_c}$ are identical. The judging current $I_{JUDGE}$ generated by the current source 350 is lower than the reference current $I_{REF1}$ generated by the current source 310.

In another embodiment, when the reference current $I_{REF1}$ and the reference current $I_{REF2}$ are in an another specified proportional relationship, or the sensed current $I_{SEN\_a}$, the sensed current $I_{SEN\_b}$, and the sensed current $I_{SEN\_c}$ are in an another specified proportional relationship, by setting different sizes of the transistors in the current mirror 320, the current mirror 330, or the current mirror 340, the relationship between the judging current $I_{JUDGE}$ and the reference current $I_{REF}$ will be modified correspondingly.

As mentioned above, the sensing device 300 of the second embodiment is not equipped with the operational amplifier. Consequently, the sensing device 300 is less sensitive to the noise. Moreover, since the data line voltage $V_{DD}$ on the data line DL of the sensing device 300 initially is determined according to the clamping voltage $V_{a}p$, it can be effectively decreased. In addition, since that the storing state of the memory cell would be judged to be in an on state as long as the cell current Icell is higher than the reference current $I_{REF1}$ generated according to the current source 310, the reference current $I_{REF1}$ can be adjusted flexibly based on actual needs, and the sensing margin in the on state can be improved. Furthermore, in some embodiment, by setting different sizes of the transistors in the current mirror 330 and the current mirror 340, the sensed current $I_{SEN\_b}$ can be scaled. In some embodiment, by setting different sizes of the transistors in the current mirror 320, the variation of the sensing margin can be improved.

Figure 5A:
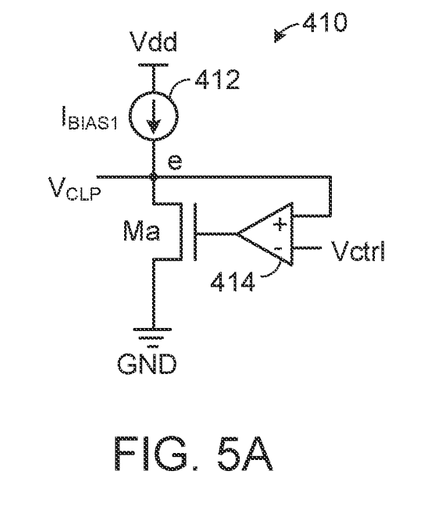
FIG. 5A is a schematic circuit diagram illustrating a first example of the voltage clamping circuit in the sensing device according to the second embodiment of the present invention.

FIG. 5A is a schematic circuit diagram illustrating a first example of the voltage clamping circuit in the sensing device according to the second embodiment of the present invention. The voltage clamping circuit 410 is configured to provide the clamping voltage $V_{CLP}$ to the gate terminal of the transistor M1 in sensing device 300. As shown in FIG. 5A, the voltage clamping circuit 410 comprises a current source 412, a transistor Ma and an operational amplifier 414.

The current source 412 is connected between the supply voltage Vdd and a node e. The current source 412 generates a bias current $I_{BIAS1}$. The drain terminal of the transistor Ma is connected with the node e. The gate terminal of the transistor Ma is connected with the output terminal of the operational amplifier 414. The source terminal of the transistor Ma receives the ground voltage GND. The first input terminal of the operational amplifier 414 receives a control voltage Vctrl. The second input terminal of the operational amplifier 414 is connected with the node e. Consequently, when the voltage clamping circuit 410 is in the normal working state, the voltage at the node e is equal to the control voltage Vctrl. In other words, the clamping voltage $V_{CLP}$ generated from the voltage clamping circuit 410 is equal to the control voltage Vctrl.

The voltage clamping circuit 410 is connected with the gate terminal of the transistor M1 in the sensing device 300. That is to say, if the control voltage Vctrl is 1V, the clamping voltage $V_{CLP}$ is 1V.

Figure 5B:
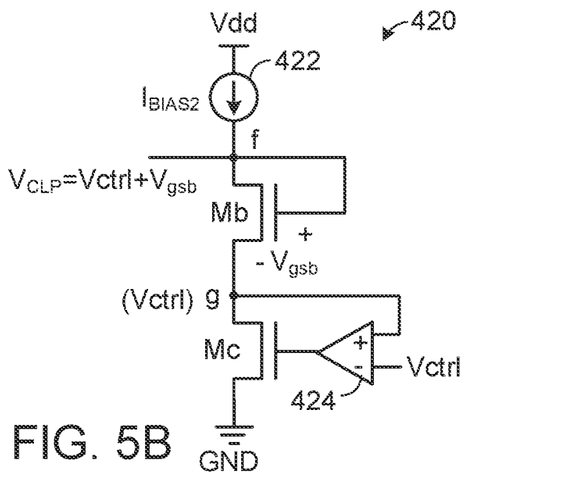
FIG. 5B is a schematic circuit diagram illustrating a second example of the voltage clamping circuit in the sensing device according to the second embodiment of the present invention.

FIG. 5B is a schematic circuit diagram illustrating a second example of the voltage clamping circuit in the sensing device according to the second embodiment of the present invention. The voltage clamping circuit 420 is configured to provide the clamping voltage $V_{CLP}$ to the gate terminal of the transistor M1 in sensing device 300. As shown in FIG. 5B, the voltage clamping circuit 420 comprises a current source 422, a transistor Mb, a transistor Mc and an operational amplifier 424.

The current source 422 is connected between the supply voltage Vdd and a node f. The current source 422 generates a bias current $I_{BIAS2}$. The drain terminal of the transistor Mb is connected with the node f, and the gate terminal of the transistor Mb is connected with the node f. The gate terminal of the transistor Mb is connected with the gate terminal of the transistor M1 in the sensing device 300. The source terminal of the transistor Mb is connected with a node g. Consequently, the transistor Mb may be regarded as a diode-connected transistor. The drain terminal of the transistor Mc is connected with the node g. The gate terminal of the transistor Mc is connected with the output terminal of the operational amplifier 424. The source terminal of the transistor Mc receives the ground voltage GND. Moreover, the first input terminal of the amplifier 424 receives a control voltage Vctrl. The second input terminal of the operational amplifier 424 is connected with the node g. Consequently, when the voltage clamping circuit 420 is in the normal working state, the voltage at the node g is equal to the control voltage Vctrl, and the voltage at the gate terminal of the transistor Mb is equal to the control voltage Vctrl plus a gate-source voltage $V_{gsb}$ of the transistor Mb. In other words, the clamping voltage $V_{CLP}$ generated from the voltage clamping circuit 410 is equal to the sum of the control voltage Vctrl and the gate-source voltage $V_{gsb}$ (i.e., $V_{CP}$=Vctrl+$V_{gsb}$).

By using the transistor Mb identical to the transistor M1 in the sensing device 300 and setting the reference current $I_{REF2}$ equal to the bias current $I_{BIAS2}$, the gate-source voltage with variation would be eliminated. In the sensing device 300, the data line voltage $V_{DL}$ would be equal to the clamping voltage $V_{CLP}$ minus the gate-source voltage $V_{gs1}$ of transistor M1. That is, $V_{DL}$=($V_{CLP}$-$V_{gs1}$)=(Vctrl+$V_{gsb}$)-$V_{gs1}$=Vctrl. If the control voltage Vctrl is 0.3V, the gate-source voltages of the transistor M1 and Mb are 0.7V, the clamping voltage $V_{CLP}$ is 1V, and the data line voltage $V_{DL}$ is pre-charged to be 0.3V more accurately.

In the sensing device 300 of the second embodiment, the judging element 360 comprises the logic buffers 362 and 364. It is noted that numerous modifications and alterations may be made while retaining the teachings of the invention. For example, in another embodiment, the judging element 230 with the comparator 232 as described in the first embodiment can be used as the judging element 360 of the sensing device 400 of the second embodiment.

It is noted that the circuitry structures of the mirror circuits 320, 330 and 340 are not restricted to the circuitry structure as shown in FIG. 3. That is, the circuitry structures of the mirror circuits may be modified according to the practical requirements.

Generally, the variation of the pulse width of the reset pulse may influence the sensing time and the judging result of the sensing device 300. For improving the judging result of the sensing device 300, a reset pulse generator is used. It is noted that the circuitry structure of the reset pulse generator is not restricted.

As well known in the art, the solid state drive (SSD) at least comprises a memory cell array and a sensing module. The sensing module comprising a plurality of sensing devices connected to a plurality of data line of the memory cell array to indicate storing states of the corresponding memory cells during one sense cycle. For example, the sensing module includes 16 sensing devices connected to 16 data lines of the memory cell array. Thus, the sensing module is capable of generating 16 output data corresponding to the 16 memory cells during one sense cycle.

Figures 6A, 6B:
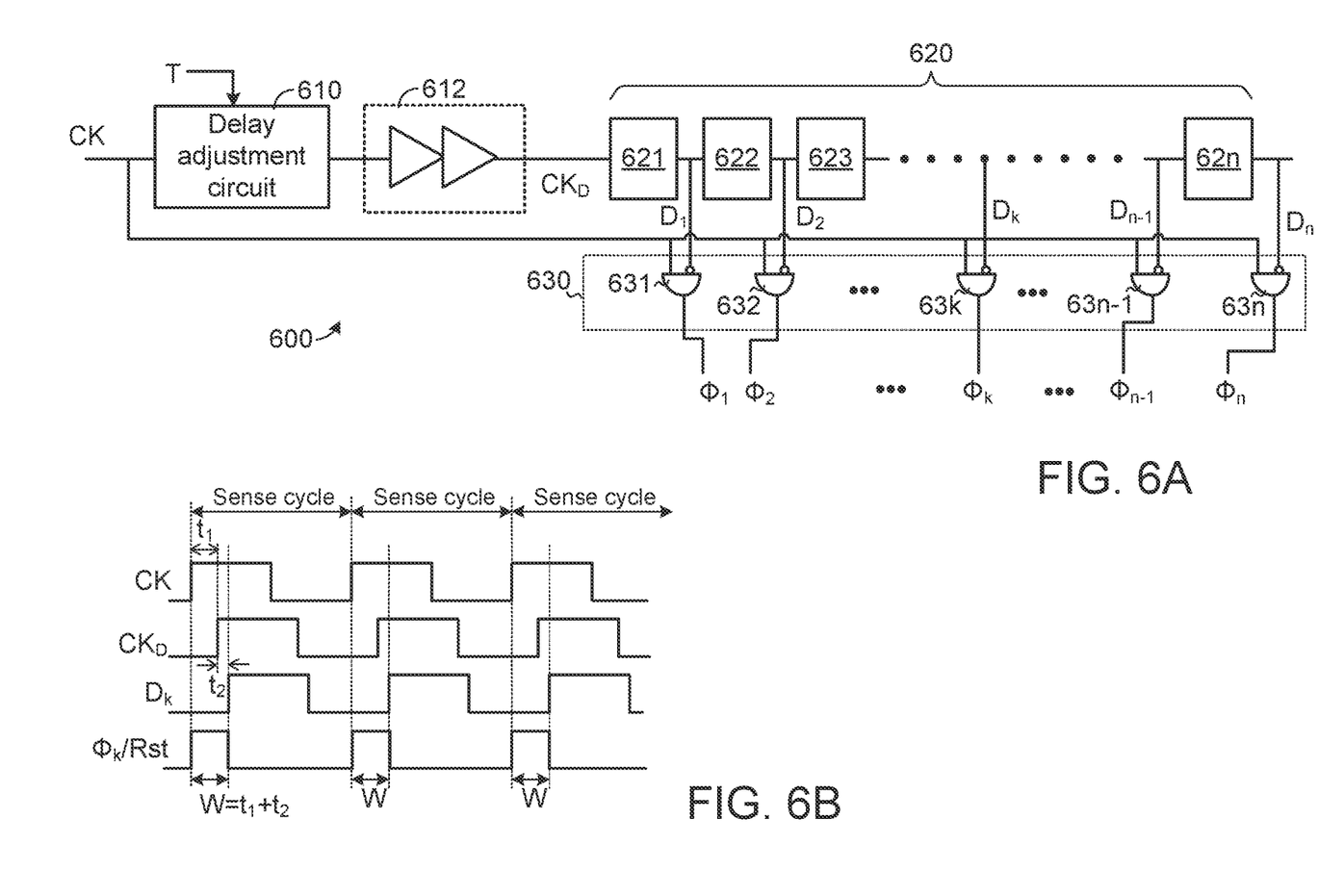
FIG. 6A is a schematic circuit diagram illustrating a reset pulse generator for the sensing device according to the second embodiment of the present invention.
FIG. 6B is a schematic timing waveform illustrating the associated signals of the reset pulse generator as shown in FIG. 6A.

FIG. 6A is a schematic circuit diagram illustrating a reset pulse generator for the sensing device according to the second embodiment of the present invention. FIG. 6B is a schematic timing waveform illustrating the associated signals of the reset pulse generator as shown in FIG. 6A. The reset pulse generator 600 comprises a delay adjustment circuit 610, a word line driver 612, a word line load 620 and a combinational logic circuit 630.

The delay adjustment circuit 610 receives a clock signal CK and an adjusting signal T. The word line driver 612 is connected to the output of the delay adjustment circuit 610. The word line driver 612 generates a delayed clock signal $CK_D$ to the word line load 620. Moreover, the word line load 620 generates plural loading signals $D_1 \sim D_n$. The combinational logic circuit 630 receives the plural loading signals D1~Dn and the clock signal CK. Moreover, the combinational logic circuit 630 generates plural pulse signals $\phi 1 \sim \phi n$. In the sensing device 300, the control terminal of the switch $SW_2$ receives one of the pulse signals $\phi 1 \sim \phi n$ as the reset pulse Rst.

The word line load 620 comprises n loading devices 621~62n, which are connected with each other in series. For example, n is equal to 1024. The first loading device 621 receives the delayed clock signal $CK_D$. The plural loading devices 621~62n generate the corresponding loading signals $D_1 \sim D_n$, respectively. After the input signal received by each loading device is delayed for a fixed phase difference, the corresponding output signal is generated. For example, the loading device 622 receives the loading signal $D_1$ and generates the loading signal $D_2$, wherein the loading signal $D_2$ lags the loading signal $D_1$ by the fixed phase difference.

The combinational logic circuit 630 comprises n combinational logic devices 631~63n. The first terminals of the combinational logic devices 631~63n receive the clock signal CK. The second terminals of the combinational logic devices 631~63n receive the corresponding loading signals $D_1 \sim D_n$, respectively. The output terminals of the combinational logic devices 631~63n generate the corresponding pulse signals $\phi 1 \sim \phi n$, respectively. Moreover, the structures of the combinational logic devices 631~63n are identical. For example, the combinational logic device 631 comprises an AND gate and a NOT gate. The first input terminal of the AND gate receives the clock signal CK. The input terminal of the NOT gate receives the loading signal $D_1$. The output terminal of the NOT gate is connected with the second input terminal of the AND gate. The output terminal of the AND gate generates the pulse signal $\phi 1$.

According to an embodiment of the present invention, the sensing module receives a portion of the pulse signals $\phi 1 \sim \phi n$ generated from the reset pulse generator 600. For example, n and k are integers, and n is greater than or equal to k. The sensing module includes k sensing devices, each of which is the same as shown in FIG. 3. The k sensing devices receive the k pulse signals $\phi 1 \sim \phi k$ as the corresponding reset pulses Rst.

In other words, the first sensing device of the sensing module receives the pulse signal $\phi 1$ as the reset pulse Rst. The second sensing device of the sensing module receives the pulse signal $\phi 2$ as the reset pulse Rst. And so on, the kth sensing device of the sensing module receives the pulse signal $\phi k$ as the reset pulse Rst.

As shown in FIG. 6B, one cycle of the clock signal CK is one sense cycle. According to the adjusting signal T, the delay adjustment circuit 610 is controlled to allow the delayed clock signal $CK_D$ to lag the clock signal CK by a delay time $t_1$. In addition, the delayed clock signal $CK_D$ lags the loading signal $D_k$ by a time difference $t_2$. For example, the pulse signal $\phi k$ is received by the kth sensing device of the sensing module as the reset pulse Rst, and the pulse width W of the reset pulse Rst is equal to $(t_1+t_2)$. In other words, the reset pulse Rst with the optimized pulse width can be applied to the kth sensing device of the sensing module.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sensing device for a non-volatile memory, the non-volatile memory comprising a memory cell, the memory cell being connected with a data line during a sense cycle, the sensing device comprising:

a first current source, wherein the first current source is connected between a supply voltage and a first node, and the first current source generates a reference current;

a first current mirror, wherein an input terminal of the first current mirror is connected with the first node, a mirroring terminal of the first current mirror is connected with a second node, and the second node is connected with the data line;

a first switch, wherein a first terminal of the first switch is connected with the second node, and a control terminal of the first switch receives an inverted reset pulse;

a second switch, wherein a first terminal of the second switch is connected with the second node, a second terminal of the second switch receives a ground voltage, and a control terminal of the second switch receives a reset pulse;

a first transistor, wherein a drain terminal of the first transistor is connected with a third node, a source terminal of the first transistor is connected with a second terminal of the first switch, and a gate terminal of the first transistor receives a clamping voltage;

a second current mirror, wherein an input terminal of the second current mirror is connected with the third node, and a mirroring terminal of the second current mirror is connected with a fourth node;

a third current mirror, wherein an input terminal of the third current mirror is connected with the fourth node, and a mirroring terminal of the third current mirror is connected with a judging node;

a second current source connected between the supply voltage and the judging node, wherein the second current source generates a judging current; and a judging element, wherein an input terminal of the judging element is connected with the judging node, and an output terminal of the judging element generates an output data.

2. The sensing device as claimed in claim 1, wherein the first current mirror comprises:

a second transistor, wherein a drain terminal of the second transistor is connected with the first node, a gate terminal of the second transistor is connected with the first node, and a source terminal of the second transistor receives the ground voltage; and a third transistor, wherein a drain terminal of the third transistor is connected with the second node, a gate terminal of the third transistor is connected with the first node, and a source terminal of the third transistor receives the ground voltage.

3. The sensing device as claimed in claim 1, wherein the second current mirror comprises:

a second transistor, wherein a drain terminal of the second transistor is connected with the third node, a gate terminal of the second transistor is connected with the third node, and a source terminal of the second transistor receives the supply voltage; and a third transistor, wherein a drain terminal of the third transistor is connected with the fourth node, a gate terminal of the third transistor is connected with the third node, and a source terminal of the third transistor receives the supply voltage.

4. The sensing device as claimed in claim 1, wherein the third current mirror comprises:

a second transistor, wherein a drain terminal of the second transistor is connected with the fourth node, a gate terminal of the second transistor is connected with the fourth node, and a source terminal of the second transistor receives the ground voltage; and a third transistor, wherein a drain terminal of the third transistor is connected with the judging node, a gate terminal of the third transistor is connected with the fourth node, and a source terminal of the third transistor receives the ground voltage.

5. The sensing device as claimed in claim 1, wherein the judging element comprises:

a first logic buffer, wherein an input terminal of the first logic buffer is connected with the judging node; and a second logic buffer, wherein an input terminal of the second logic buffer is connected with an output terminal of the first logic buffer, and an output terminal of the second logic buffer generates the output data.

6. The sensing device as claimed in claim 1, wherein the judging element comprises a comparator, wherein a first input terminal of the comparator is connected with the judging node, a second input terminal of the comparator receives a comparison voltage, and an output terminal of the comparison voltage generates the output data, wherein the comparison voltage is higher than the ground voltage, and the comparison voltage is lower than the supply voltage.

7. The sensing device as claimed in claim 1, wherein the sensing device further comprises a voltage clamping circuit, and the voltage clamping circuit comprises:

a third current source, wherein the third current source is connected between the supply voltage and a fifth node, the third current source generates a bias current, and a voltage at the fifth node is the clamping voltage;

a second transistor, wherein a drain terminal of the second transistor is connected with the fifth node, and a source terminal of the second transistor receives the ground voltage; and an operational amplifier, wherein a first input terminal of the operational amplifier receives a control voltage, a second input terminal of the operational amplifier is connected with the fifth node, and an output terminal of the operational amplifier is connected with a gate terminal of the second transistor.

8. The sensing device as claimed in claim 1, wherein the sensing device further comprises a voltage clamping circuit, and the voltage clamping circuit comprises:

a third current source, wherein the third current source is connected between the supply voltage and a fifth node, the third current source generates a bias current, and a voltage at the fifth node is the clamping voltage;

a second transistor, wherein a drain terminal of the second transistor is connected with the fifth node, a gate terminal of the second transistor is connected with the fifth node, and a source terminal of the second transistor is connected with a sixth node;

a third transistor, wherein a drain terminal of the third transistor is connected with the sixth node, and a source terminal of the third transistor receives the ground voltage; and an operational amplifier, wherein a first input terminal of the operational amplifier receives a control voltage, a second input terminal of the operational amplifier is connected with the sixth node, and an output terminal of the operational amplifier is connected with a gate terminal of the third transistor.

9. The sensing device as claimed in claim 1, wherein the sensing device further comprises a reset pulse generator, and the reset pulse generator comprises:

a delay adjustment circuit receiving a clock signal and an adjusting signal;

a word line driver connected to an output terminal of the delay adjustment circuit, wherein the word line driver generates a delayed clock signal;

a word line load receiving the delayed clock signal, and generating plural loading signals; and a combinational logic circuit receiving the plural loading signals and the clock signal, and generating plural pulse signals;

wherein the control terminal of the second switch receives one of the pulse signals as the reset pulse.

10. The sensing device as claimed in claim 1, wherein if a cell current from the memory cell is lower than the reference current, the first transistor is turned on, a judging voltage at the judging node is pulled down, and the judging circuit generates the output data with a first logic level to indicate that the memory cell is in an off state.

11. The sensing device as claimed in claim 10, wherein if the cell current from the memory cell is higher than of the reference current, the first transistor is turned off, the judging voltage at the judging node is pulled up, and the judging circuit generates the output data with a second logic level to indicate that the memory cell is in an on state.

12. A sensing device for a non-volatile memory, the non-volatile memory comprising a memory cell, the memory cell being connected with a data line for generating a cell current to a first node during a sense cycle, the sensing device comprising:
 a reference circuit, connected to a first node, configured to provide a reference current;
 a first switch, having a first terminal connected with the first node and a control terminal configured to receive an inverted reset pulse;
 a second switch, having a first terminal connected with the first node, a second terminal configured to receive a ground voltage, and a control terminal configured to receive a reset pulse, wherein the reset pulse is complementary to the inverted reset pulse;
 a sensing circuit connected between a second terminal of the first switch and a second node, configured to generate a first sensed current according to a difference between the cell current and the reference current; and
 a judging circuit connected to the second node, configured to receive the first sensed current and generate an output data according to the first sensed current;
 wherein when the cell current is higher than the reference current, the first sensed current is substantially equal to zero and the output data corresponds to a first logic level;
 wherein when the cell current is lower than the reference current, the first sensed current is higher than zero and the output data corresponds to a second logic level.

13. The sensing device as claimed in claim 12, wherein during a reset phase of the sense cycle, the a first switch is in an opened state, the second switch is in a closed state, and a voltage at the first node is set to be equal to the ground voltage.

14. The sensing device as claimed in claim 12, wherein the sensing circuit comprises a clamping transistor connected to the second terminal of the first switch, and a gate terminal of the clamping transistor is configured to receive a clamping voltage;
 wherein during a pre-charge phase of the sense cycle, the first switch is in a closed state, the second switch is in an opened state, and the first node is pre-charged to an initial voltage lower than the clamping voltage.

15. The sensing device as claimed in claim 14, wherein when the cell current is higher than the reference current, during a sense phase of the sense cycle following the pre-charge phase, the clamping transistor is turned off, a voltage at the first node is higher than the initial voltage, and the output data indicates that the memory cell is in an on state.

16. The sensing device as claimed in claim 14, wherein when the cell current is lower than the reference current, during a sense phase of the sense cycle following the pre-charge phase, the clamping transistor is turned on and the output data indicates that the memory cell is in an off state.

17. The sensing device as claimed in claim 12, wherein when the cell current is lower than the reference current during a sense phase of the sense cycle, the output data indicates that the memory cell is in an off state.

18. The sensing device as claimed in claim 17, wherein when the cell current is higher than the reference current during the sense phase of the sense cycle, the output data indicates that the memory cell is in an on state.

19. The sensing device as claimed in claim 12, wherein the judging circuit is configured to receive a judging current and generate a second sensed current according to the first sensed current;
 wherein when the second sensed current is larger than the judging current, the output data corresponds to the second logic level;
 wherein when the second sensed current is lower than the judging current, the output data corresponds to the first logic level.

* * * * *